United States Patent
Chang et al.

(10) Patent No.: US 8,436,387 B2
(45) Date of Patent: May 7, 2013

(54) LIGHT EMITTING DIODE PACKAGE

(75) Inventors: Chao-Hsiung Chang, Hsinchu (TW); Ming-Ta Tsai, Hsinchu (TW)

(73) Assignee: Advanced Optoelectronic Technology, Inc., Hsinchu Hsien (TW)

(*) Notice: Subject to any disclaimer, the term of this patent is extended or adjusted under 35 U.S.C. 154(b) by 13 days.

(21) Appl. No.: 13/187,536

(22) Filed: Jul. 21, 2011

(65) Prior Publication Data
US 2012/0138983 A1 Jun. 7, 2012

(30) Foreign Application Priority Data
Dec. 3, 2010 (CN) .......................... 2010 1 0573771

(51) Int. Cl.
*H01L 33/50* (2010.01)
(52) U.S. Cl.
USPC .................................... 257/98; 257/E33.061
(58) Field of Classification Search ............ 257/79–103, 257/E33.061; 438/22–47; 313/498–512
See application file for complete search history.

(56) References Cited

U.S. PATENT DOCUMENTS

| | | | | |
|---|---|---|---|---|
| 8,008,673 B2* | 8/2011 | Nagai | ............................. | 257/88 |
| 2004/0217692 A1* | 11/2004 | Cho et al. | ....................... | 313/503 |
| 2009/0140633 A1* | 6/2009 | Tanimoto et al. | ............. | 313/503 |
| 2010/0148200 A1* | 6/2010 | Lai et al. | ......................... | 257/98 |
| 2011/0019707 A1* | 1/2011 | Sato et al. | .................. | 372/45.01 |

* cited by examiner

*Primary Examiner* — Robert J Hoffberg
*Assistant Examiner* — Eric Ward
(74) *Attorney, Agent, or Firm* — Altis Law Group, Inc.

(57) ABSTRACT

An LED package includes a substrate, a blue LED chip, an encapsulant and a fluorescent layer. The blue LED chip is arranged on the substrate. The encapsulant covers the blue LED chip. The fluorescent layer is arranged on a top surface of the encapsulant. The fluorescent layer includes a first fluorescent area above the blue LED chip and a second fluorescent area encircling the first fluorescent area. The first fluorescent area includes red fluorescent substance and green fluorescent substance mixed therein. The second fluorescent area includes yellow fluorescent substance mixed therein.

17 Claims, 1 Drawing Sheet

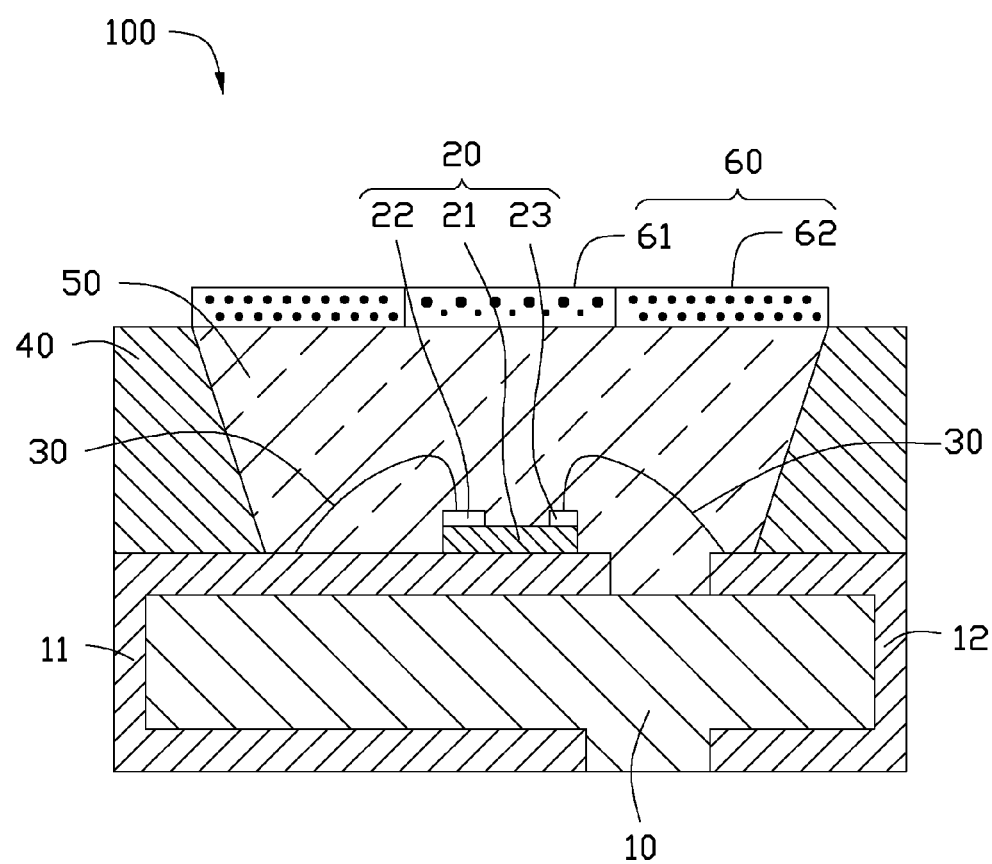

LIGHT EMITTING DIODE PACKAGE

BACKGROUND

1. Technical Field

The disclosure relates to light emitting diode (LED) packages, and particularly to a light emitting diode package with even distribution of light emission.

2. Discussion of Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source.

A typical light source module uses a blue LED chip as an initial light source to produce a white light. The blue light emitted from the blue LED chip strikes yellow fluorescent substances coated within the light source module to generate a yellow secondary color light. The combination of the yellow secondary color light and residual blue light produces a white light. However, the intensity of light emitted by the blue LED chip is unevenly distributed; as a result, the white light may have a yellow halo and not evenly illuminate.

Therefore, what is needed is a light emitting diode package which can overcome the described limitations.

BRIEF DESCRIPTION OF THE DRAWINGS

Many aspects of the disclosure can be better understood with reference to the following drawing. The components in the drawing are not necessarily drawn to scale, the emphasis instead being placed upon clearly illustrating the principles of the present light emitting diode package for microminiaturization. Moreover, in the drawing, like reference numerals designate corresponding parts throughout the whole view.

The only drawing is a schematic, cross-sectional view of a light emitting diode (LED) package according to an exemplary embodiment of the present disclosure.

DETAILED DESCRIPTION OF EMBODIMENTS

Referring to the only drawing, a light emitting diode (LED) package 100 in accordance with an exemplary embodiment of the present disclosure is illustrated. The LED package 100 includes a substrate 10, an LED chip 20 mounted on the substrate 10, two wires 30 electrically connecting the LED chip 20 to the substrate 10, an annular reflecting cup 40 disposed on the substrate 10 and surrounding the LED chip 20, an encapsulant 50 received in the reflecting cup 40 and covering the LED chip 20, and a fluorescent layer 60 arranged on a top surface of the encapsulant 50. The wires 30 preferably are made of gold.

The substrate 10 is made of $Al_2O_3$, silicon, SiC, ceramic, polymer, or electrically insulating quartz. The substrate 10 has a first electrical portion 11 and a second electrical portion 12 formed thereon. The first electrical portion 11 and the second electrical portion 12 extend from a top face of the substrate 10 to a bottom face thereof along an outer edge of the substrate 10, whereby the LED package 100 is formed as a surface mounting type device.

The blue LED chip 20 is mounted on the first electrical portion 11 of the substrate 10. The blue LED chip 20 includes a semiconductor structure 21, and a first electrode 22 and a second electrode 23 disposed on a top face of the semiconductor structure 21. The first electrode 22 is electrically connected to the first electrical portion 11 of the substrate 10 via one wire 30, and the second electrode 23 is electrically connected to second electrical portion 12 of the substrate 10 via the other wire 30. In an alternative embodiment, the blue LED chip 20 can be electrically connected to the first electrical portion 11 and the second electrical portion 12 via flip-chip.

The reflecting cup 40 surrounds the blue LED chip 20. The reflecting cup 40 is made of a mixture which includes titanium dioxide ($TiO_2$), hardener, and a compound of epoxy resin and silicone. In the present embodiment, the blue LED chip 20 is arranged at a center of a bottom of the reflecting cup 40. It can be understood that the substrate 10 and the reflecting cup 40 can be formed integrally from the same material as a single piece.

The encapsulant 50 is made of transparent materials, such as silicone, epoxy, quartz, or glass. In this embodiment, a top surface of the encapsulant 50 is substantially coplanar with a top surface of the reflecting cup 40.

The fluorescent layer 60 is arranged on the top surface of the encapsulant 50. In the present embodiment, the fluorescent layer 60 includes a first fluorescent area 61 and a second fluorescent area 62 surrounding the first fluorescent area 61. The first fluorescent area 61 is located at a central portion of the fluorescent layer 60 and is directly above the blue LED chip 20. In the present embodiment, the first fluorescent area 61 is circular and the second fluorescent area 62 is annular. The fluorescent layer 60 has a bottom surface in contact with the top surface of the encapsulant 50; in other words, the fluorescent layer 60 substantially overlays the top surface of the encapsulant 50.

The first fluorescent area 61 includes red fluorescent substances and green fluorescent substances mixed therein. The second fluorescent area 62 includes yellow fluorescent substances mixed therein. In the present embodiment, the red and green fluorescent substances are mixed and are evenly distributed in the first fluorescent area 61. The yellow fluorescent substances are evenly distributed in the second fluorescent area 62. The red fluorescent substances can be selected from nitrides, sulfides, or silicates. The green fluorescent substances can be selected from nitrogen oxides, sulfides, or silicates. The yellow fluorescent substances can be selected from YAG, or silicates. In the present embodiment, a density of the mixture of the red and green fluorescent substances in the first fluorescent area 61 is substantially equal to that of the yellow fluorescent substance in the second fluorescent area 62.

A part of blue light emitted from the blue LED chip 20 to the second fluorescent area 62 strikes the yellow fluorescent substances distributed in the second fluorescent area 62 to generate a white light. Other part of blue light emitted from the blue LED chip 20 to the first fluorescent area 62 strikes the red and green fluorescent substances distributed in the first fluorescent area 61 to generate a white light. An intensity of light emitted by the LED chip gradually decrease from a center area of the LED chip towards the surrounding areas, i.e., an intensity of the light from the LED chip to the second fluorescent area 62 being less than that to the first fluorescent area 61. However, the light converting efficiency of the yellow fluorescent substances in the second fluorescent area 62 is higher than that of the red and green fluorescent substances in the first fluorescent 61. Therefore, the light converting efficiency of the first fluorescent area 61 is substantially equal to that of the second fluorescent area 62; thus, the white light emitted from the LED package 100 is evenly distributed.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. An LED package, comprising:
   a substrate;
   a blue LED chip arranged on the substrate;
   an encapsulant covering the blue LED chip; and
   a fluorescent layer arranged on a top surface of the encapsulant, the fluorescent layer comprising a first fluorescent area above the blue LED chip and a second fluorescent area encircling the first fluorescent area, the first fluorescent area comprising red fluorescent substances and green fluorescent substances mixed therein, the second fluorescent area comprising yellow fluorescent substances mixed therein;
   wherein a light converting efficiency of the first fluorescent area is less than that of the second fluorescent area.

2. The LED package of claim 1, wherein the first fluorescent area is circular.

3. The LED package of claim 2, wherein the second fluorescent area is annular.

4. The LED package of claim 1, wherein the first fluorescent area is located at a central of the fluorescent layer, and the second fluorescent area is located a periphery of the fluorescent layer.

5. The LED package of claim 1, wherein the red and green fluorescent substances are mixed and are evenly distributed in the first fluorescent area.

6. The LED package of claim 1, wherein the yellow fluorescent substance is evenly distributed in the second fluorescent area.

7. The LED package of claim 1, further comprising a reflecting cup disposed on the substrate and surrounding the blue LED chip, the encapsulant being received in the reflecting cup.

8. The LED package of claim 7, wherein the substrate is formed integrally with the reflecting cup.

9. The LED package of claim 7, wherein the blue LED chip is arranged at a center of a bottom of the reflecting cup.

10. The LED package of claim 1, wherein the fluorescent layer substantially overlays the top surface of the encapsulant.

11. An LED package, comprising:
    a substrate;
    an LED chip arranged on the substrate;
    a reflecting cup disposed on the substrate and surrounding the LED chip;
    an encapsulant received in the reflecting cup and covering the LED chip; and
    a fluorescent layer arranged on a top surface of the encapsulant, the fluorescent layer comprising a first fluorescent portion being located at a center thereof and a second fluorescent portion surrounding the first fluorescent portion, the first fluorescent portion comprising a first type of fluorescent substance therein, the second fluorescent portion comprising a second type of fluorescent substance therein, a light converting efficiency of the first type of fluorescent substance being less than that of the second type of fluorescent substance;
    wherein the LED chip is a blue LED chip, the first type of fluorescent substance is mixed red and green fluorescent substances, and the second type of fluorescent substance is yellow fluorescent substance.

12. The LED package of claim 11, wherein the first fluorescent portion is directly above the LED chip.

13. The LED package of claim 11, wherein the first fluorescent portion is circular, and the second fluorescent portion is annular 14. The LED package of claim 11, wherein the red and green fluorescent substances are evenly distributed in the first fluorescent portion.

15. The LED package of claim 11, wherein the yellow fluorescent substance is evenly distributed in the second fluorescent portion.

16. The LED package of claim 11, wherein the fluorescent layer substantially overlays the top surface of the encapsulant.

17. The LED package of claim 11, wherein a density of the yellow fluorescent substance in the second fluorescent portion is equal to that of a mixture of the green and red fluorescent substances in the first fluorescent portion.

* * * * *